(12) United States Patent
Adusumilli et al.

(10) Patent No.: US 11,430,954 B2
(45) Date of Patent: Aug. 30, 2022

(54) RESISTANCE DRIFT MITIGATION IN NON-VOLATILE MEMORY CELL

(71) Applicant: International Business Machines Corporation, Armonk, NY (US)

(72) Inventors: Praneet Adusumilli, Somerset, NJ (US); Anirban Chandra, Troy, NY (US); Takashi Ando, Eastchester, NY (US); Cheng Chi, Jersey City, NJ (US); Reinaldo Vega, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 8 days.

(21) Appl. No.: 17/106,286

(22) Filed: Nov. 30, 2020

(65) Prior Publication Data

US 2022/0173312 A1    Jun. 2, 2022

(51) Int. Cl.
    *H01L 45/00* (2006.01)
(52) U.S. Cl.
    CPC ............ *H01L 45/126* (2013.01); *H01L 45/06* (2013.01); *H01L 45/1233* (2013.01); *H01L 45/144* (2013.01); *H01L 45/1675* (2013.01)
(58) Field of Classification Search
    CPC .................................................. H01L 45/1233
    See application file for complete search history.

(56) References Cited

U.S. PATENT DOCUMENTS

| | | | |
|---|---|---|---|
| 7,728,319 B2 | 6/2010 | Goux et al. | |
| 8,173,987 B2 * | 5/2012 | Lung | H01L 27/2454 438/102 |
| 8,178,405 B2 | 5/2012 | Lai et al. | |
| 8,693,232 B2 | 4/2014 | Perniola et al. | |
| 9,293,199 B2 | 3/2016 | Krebs et al. | |
| 9,444,043 B2 | 9/2016 | Pellizzer et al. | |

(Continued)

FOREIGN PATENT DOCUMENTS

| | | |
|---|---|---|
| CN | 1506973 | 6/2004 |
| CN | 101783390 | 7/2010 |

(Continued)

OTHER PUBLICATIONS

Authorized Officer Tian,Shufeng, PRC National IP Administration as ISA, related PCT application PCT/CN2021/124294, ISR and Written Opinion, 9 pages total, dated Jan. 19, 2022.

*Primary Examiner* — Mounir S Amer
(74) *Attorney, Agent, or Firm* — Daniel Morris; Otterstedt & Kammer PLLC

(57) ABSTRACT

A mushroom-type Phase-Change Memory (PCM) device includes a substrate, a lower interconnect disposed in the substrate, a first dielectric layer disposed on the substrate, a bottom electrode disposed in the first dielectric layer and extending above an upper surface of the first dielectric layer, a type drift-mitigation liner encircling an upper portion of the bottom electrode extending above the upper surface of the first dielectric layer, a PCM element disposed on the liner and an upper surface of the bottom electrode, a top electrode disposed on the PCM element, and a second dielectric layer disposed on an exposed portion of the first dielectric layer and the top electrode, wherein the second dielectric layer is disposed on sidewalls of the liner, the PCM element, and the top electrode.

15 Claims, 7 Drawing Sheets

(56) References Cited

U.S. PATENT DOCUMENTS

| | | | |
|---|---|---|---|
| 10,056,546 | B2 | 8/2018 | BrightSky et al. |
| 2004/0113136 | A1 | 6/2004 | Dennison |
| 2008/0272358 | A1 | 11/2008 | Lin et al. |
| 2009/0026436 | A1 | 1/2009 | Song et al. |
| 2009/0251944 | A1 | 10/2009 | Happ et al. |
| 2014/0306172 | A1 | 10/2014 | Sills et al. |
| 2021/0242399 | A1* | 8/2021 | Lee .................. H01L 45/1675 |
| 2022/0102625 | A1* | 3/2022 | Chandrasekaran ... H01L 45/146 |
| 2022/0102626 | A1* | 3/2022 | Li ...................... H01L 45/1608 |

FOREIGN PATENT DOCUMENTS

| | | |
|---|---|---|
| CN | 106206639 | 12/2016 |
| TW | I299567 | 8/2008 |

\* cited by examiner

RESISTANCE DRIFT MITIGATION IN NON-VOLATILE MEMORY CELL

BACKGROUND

The present invention relates to semiconductor devices and more particularly to a method of forming mushroom-type Phase-Change Memory (PCM) device with a drift-mitigation liner, where the bottom surface of phase change material is in direct contact with both the drift-mitigation liner and the bottom electrode.

Phase-Change Memory (PCM) is based on a chalcogenide glass material, which changes its phase from crystalline to amorphous and back again when suitable electrical currents are applied. GST alloy (germanium-antimony-tellurium or $Ge_2Sb_2Te_5$) is one such chalcogenide glass material. Each phase has a differing resistance level, which is stable until the phase is changed. The maximum and minimum resistance levels in a PCM device are the basis for binary one or zero values.

During electrical programming of the PCM device, at least some (or in some cases all) of the phase change material undergoes phase transformations, which changes the electrical resistance of the PCM device.

Phase change materials suffer from resistance-drift, prominently in the amorphous phase, where resistance increases over time according to a power law. Resistant-drift needs to be mitigated for analog computing applications where multiple states are required for computation.

Resistance drift over time is particularly challenging for multi-level cell operations, such as those used in connection with Artificial Intelligence Training and Inference applications. Multi-level cell operations can be compared to conventional (binary) resistive memory cells, which have two states including a high resistance state and a low resistance state corresponding to 1 or 0. Resistive memory devices are an example of multi-level cell devices, which have more than two states, and are used to represent a synaptic weight of an artificial neural network.

A liner with a tuned resistivity has been proposed in order to mitigate resistance-drift. However, the presence of a resistive liner over and across the bottom electrode can lead to multiple challenges: (a) An increase in the SET state resistance which leads to a lower dynamic range (RESET-to-SET resistance ratio) (b) The joule heating can be concentrated in the liner film on top of the bottom-electrode, thus making the cell more thermally inefficient, and requiring a significant increase in programming voltage for the crystalline to amorphous phase transition. This can dramatically increase the programming voltage needed to achieve the RESET condition where the amorphous volume fully covers the bottom electrode.

BRIEF SUMMARY

According to an embodiment of the present invention, A mushroom-type Phase-Change Memory (PCM) device comprising a substrate, a first dielectric layer disposed on the substrate, a bottom electrode disposed in the first dielectric layer, a drift-mitigation liner disposed on the first dielectric layer, a PCM element disposed directly on the drift-mitigation liner and an upper surface of the bottom electrode, a top electrode disposed on the PCM element, and a second dielectric layer disposed on an exposed portion of the first dielectric layer and the top electrode, wherein the second dielectric layer is disposed on sidewalls of the drift-mitigation liner, the PCM element, and the top electrode.

a mushroom-type Phase-Change Memory (PCM) device comprises a substrate, a lower interconnect disposed in the substrate, a first dielectric layer disposed on the substrate, a bottom electrode disposed in the first dielectric layer and extending above an upper surface of the first dielectric layer, a drift-mitigation liner encircling an upper portion of the bottom electrode extending above the upper surface of the first dielectric layer, a PCM element disposed on the liner and an upper surface of the bottom electrode, a top electrode disposed on the PCM element, and a second dielectric layer disposed on an exposed portion of the first dielectric layer and the top electrode, wherein the second dielectric layer is disposed on sidewalls of the liner, the PCM element, and the top electrode.

According to some embodiments, a method of manufacturing a mushroom-type Phase-Change Memory (PCM) device includes providing an intermediate device comprising a substrate and a lower interconnect disposed in the substrate, a first dielectric layer disposed on the substrate, a drift-mitigation liner disposed on the first dielectric layer, and a second dielectric layer formed on the drift-mitigation liner, depositing, sequentially, a low-temperature oxide (LTO) hardmask layer, a Silicon-Containing Anti-Reflective Coating Layer (SiARC) layer, and a photoresist (PR) layer on the intermediate device, patterning the PR layer to form a PR mask, forming a bottom electrode via by patterning through the drift-mitigation liner layer using the PR mask, removing the LTO hardmask layer, performing a bottom electrode metallization process to form a bottom electrode metal, polishing the PCM device to exposing the second dielectric layer, removing a remainder of second dielectric layer, depositing a PCM layer and a top electrode metal, the PCM layer being deposited directly on the drift-mitigation liner layer and the bottom electrode, patterning the drift-mitigation liner layer, the PCM layer and the top electrode metal are to form the drift-mitigation liner, a PCM and a top electrode, depositing a third dielectric layer over the PCM device, depositing an oxide interlayer dielectric (ILD) over the PCM device, and planarizing the PCM device.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media)

and implemented on a hardware processor, or (iii) a combination of (i) and (ii); any of (i)-(iii) implement the specific techniques set forth herein.

Techniques of the present invention can provide substantial beneficial technical effects. For example, one or more embodiments may provide for:
- a structure where resistance drift mitigation is possible without a concomitant increase in programming voltage; and
- a structure where the read resistance for SET state does not increase with the presence of the liner thus preserving a larger dynamic range (SET/RESET resistance ratio).

These and other features and advantages of the present invention will become apparent from the following detailed description of illustrative embodiments thereof, which is to be read in connection with the accompanying drawings.

BRIEF DESCRIPTION OF THE SEVERAL VIEWS OF THE DRAWINGS

Preferred embodiments of the present invention will be described below in more detail, with reference to the accompanying drawings.

DETAILED DESCRIPTION

Embodiments of the present invention are directed to a mushroom-type PCM device includes a drift-mitigation liner, where the bottom electrode directly contacts the PCM and the drift-mitigation liner contacts the bottom electrode on its side. This structure achieves resistance-drift mitigation without an increase in programming voltage (and current), and without impacting SET resistance when compared with a memory cell without liner.

Figure 1:
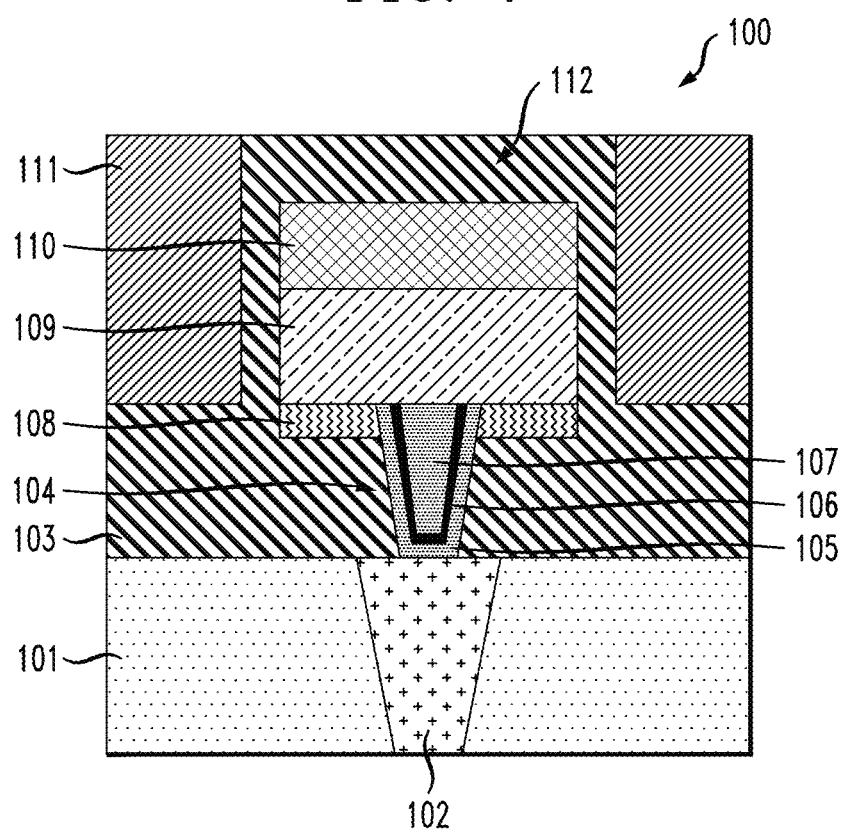
FIG. 1 shows a PCM device according to at least one embodiment of the present invention.

FIG. 1 shows a cross-section of a mushroom-type PCM device 100 according to an embodiment of the present invention. Referring to FIG. 1, the mushroom-type PCM device 100 comprises a substrate 101 and a lower interconnect 102 (lower wiring level). The mushroom-type PCM device 100 is encapsulated in a first dielectric layer 103 (e.g., silicon nitride (SiN) layer) and an oxide 111. The mushroom-type PCM device 100 further comprises a bottom electrode 104 comprising an outer portion 105 formed of a tantalum nitride (TaN), a middle portion 106 formed of a titanium nitride (TiN), and an inner portion 107 formed of TaN. An upper portion of the bottom electrode 104 is encircled by a liner 108. According to some embodiments of the present invention, the liner 108 does not cover a top of the bottom electrode 104. A PCM 109 is formed on upper surfaces of the bottom electrode 104 and the liner 108, and a top electrode 110 is formed on the PCM 109. According to one or more embodiments, the PCM 109 is in direct contact with both the bottom electrode 104 and the liner 108.

The liner 108 can be formed of, for example, a carbon material, TiN, TaN, titanium carbide (TiC), tantalum carbide (TaC), titanium aluminum nitride (TiAlN), tantalum aluminum nitride (TaAlN), titanium aluminum carbide (TiAlC), tantalum aluminum carbide (TaAlC), nitridohafnium (HfN), or tungsten carbide (WC).

The PCM 109 can be formed of, for example, GST (germanium-antimony-tellurium or Ge2Sb2Te5), GeTe, Sb2Te3, Sb, or other binary or ternary alloy compositions with Ge, Te and Sb. The PCM 109 can include additional dopants including carbon, nitrogen, silicon, silicon dioxide, silicon carbide, or SiN.

According to some embodiments, and as shown in FIG. 1, the liner 108 is a drift-mitigation liner in direct contact with PCM 109, and the bottom electrode 104 is also in direct contact with the PCM 109. According to at least one embodiment, the liner 108 does not cover a top of the bottom electrode 104. According to some embodiments, the liner 108 may partially cover the top of the bottom electrode. According to at least one embodiment, the liner 108 extends along a full width of the PCM 109 and the liner 108 is not in direct contact with the top electrode 110.

The top electrode 110 and the bottom electrode 104 can be formed of, for example, TiN, TaN, tungsten nitride (WN), HfN, WC, TiC, or TaC. According to some embodiments, the electrodes can be formed of a single layer or multiple layers of the aforementioned films. According to some embodiments, the bottom electrode 104 includes an SiN film as one of the layers.

Figure 2:
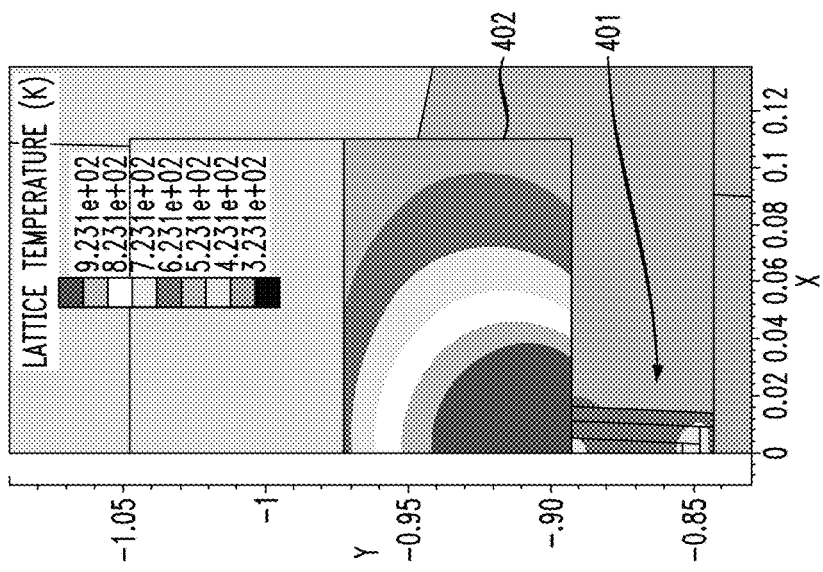
FIG. 2 shows a PCM device having a liner formed on a bottom electrode.
Figure 3:
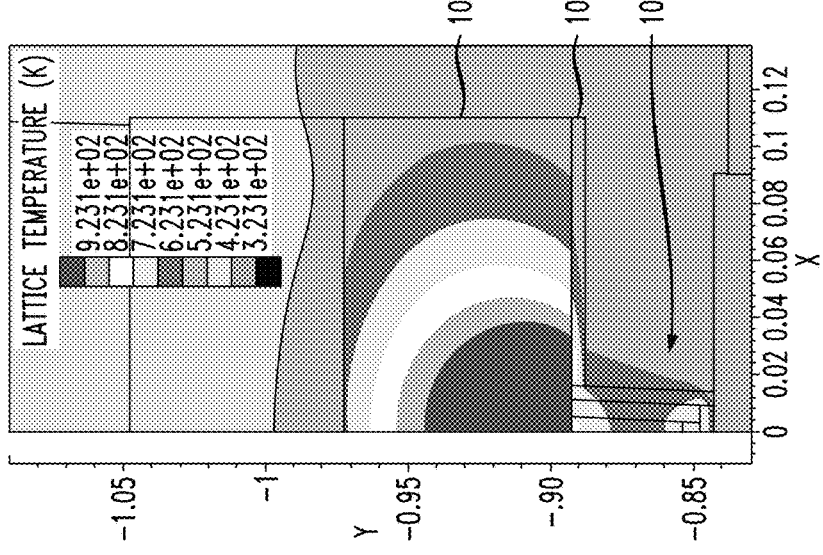
FIG. 3 shows temperatures in a PCM device having a liner according to embodiments of the present invention.
Figure 4:
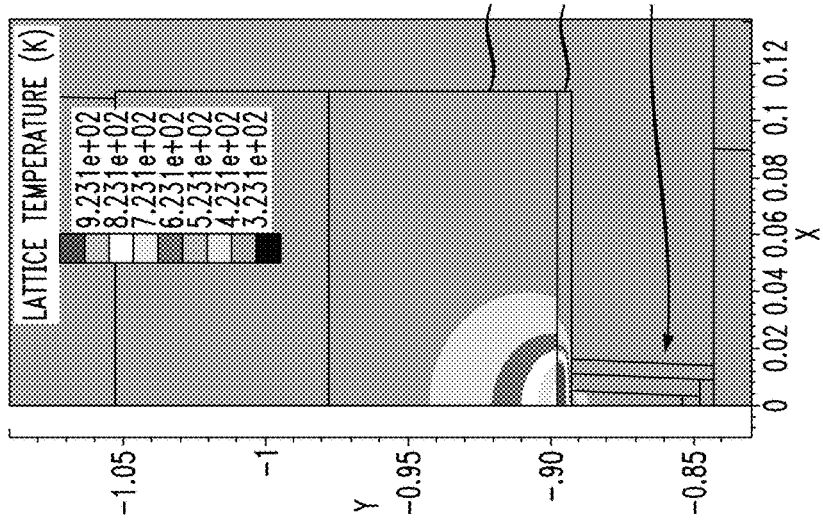
FIG. 4 shows a PCM device having no liner.

FIGS. 2-4 show temperature profiles of different devices when 2.5 Volts (V) are applied.

FIG. 2 shows a prior art device 200 including a liner 201 completely separating a bottom electrode 202 from a PCM 203. When a voltage (e.g., 2.5V) is applied across the device 200, due to a significant voltage drop across the liner 201 directly above the bottom electrode 202, and a concentration of joule heating in the liner 201, temperature in the PCM 203 does not reach a melting point (i.e., the temperature needed for amorphous phase transition).

FIG. 3 shows a mushroom-type PCM device 100 according to an embodiment of the present invention in which the liner 108 includes an opening through which the bottom electrode 104 extends, and the liner 108 and the bottom electrode contact the PCM 109. That is, the liner 108 does not cover a top of the bottom electrode 104 and the PCM 109 is in direct contact with both the bottom electrode 104 and the liner 108. As shown in FIG. 3, the temperature of the PCM 109 when a voltage of 2.5V is applied is heated to a minimum temperature of 5.231e+02 Kelvin (K), resulting in a reduced SET resistance, an increased dynamic range, and a reduced switching voltage.

FIG. 4 shows a prior art device 400 omitting a liner, such that a bottom electrode 401 contacts the PCM 402, and the PCM 402 contacts an underlying liner resulting in no resistance-drift mitigation.

Figure 5:
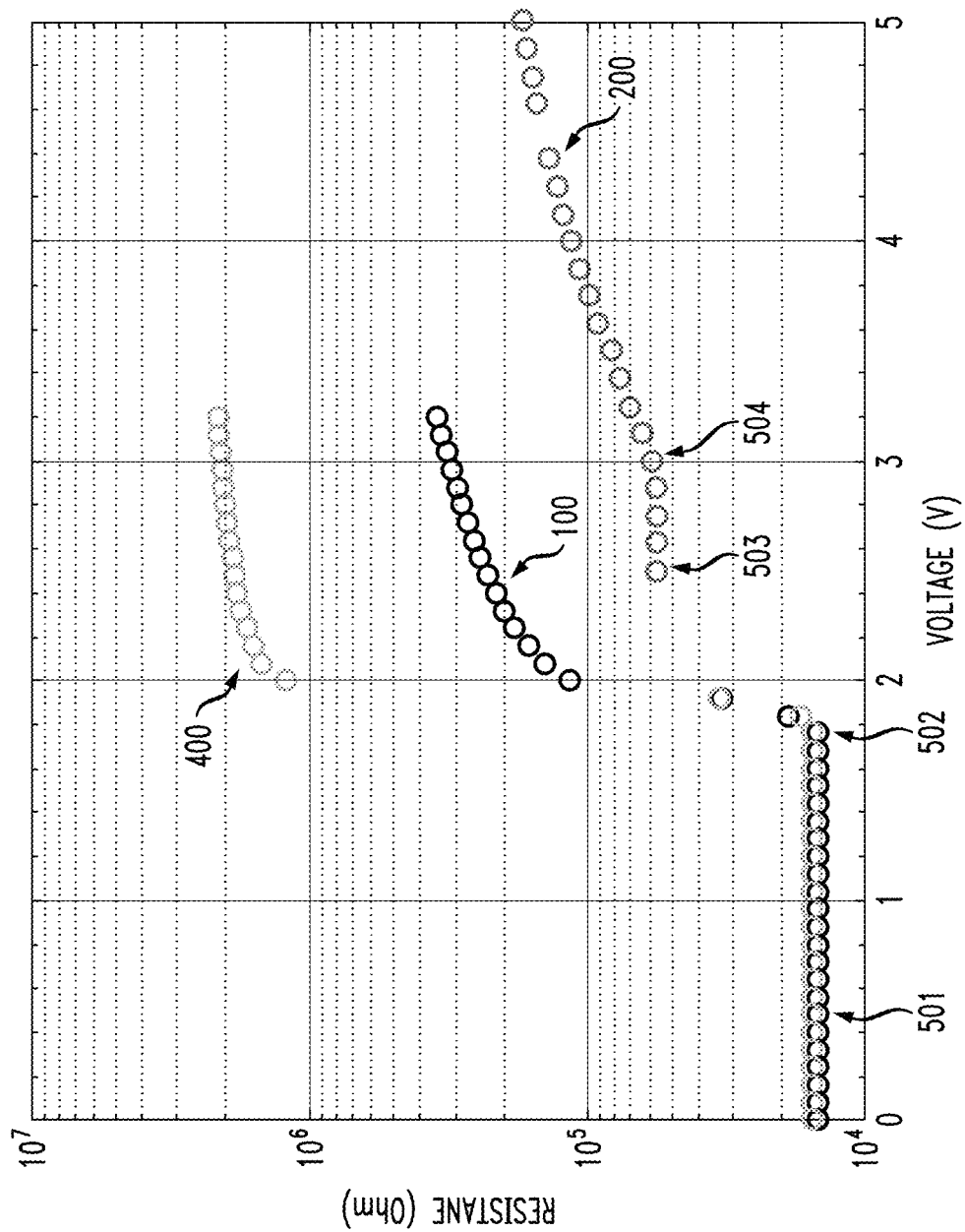
FIG. 5 is graphs showing performance characteristics of the devices of FIGS. 2-4.

FIG. 5 is a graph 500 illustrating an impact of the different devices of FIGS. 2-4 versus voltage. FIG. 5 shows the resistance versus programming voltage characteristics of the devices 100, 200, and 400.

The inventive device 100 having a liner that does not cover a top of the bottom electrode, and where the PCM is in direct contact with both the bottom electrode and the liner according to some embodiments of the present invention shows that a SET state resistance (lowest resistance state) 501 does not change, as compared to the case of a device 400 with no liner. That is, the device 100 has a large dynamic range (high resistance-to-low resistance ratio). Note the SET state resistance for the device 200 having a liner disposed on the bottom electrode is relatively high (e.g., see 503), resulting in reduced dynamic range.

Furthermore, the inventive device 100 has a programming voltage 502 (the voltage at which the device switches from a low resistance state to a higher resistance state) that is smaller than that of device 200 having the liner disposed on the bottom electrode (e.g., see programming voltage at 504), enabling lower voltage operations. A lower programming voltage can enable reduction of the areal footprint of the unit cell (e.g., minimum circuit block) required for applications including artificial intelligence.

Figure 6:
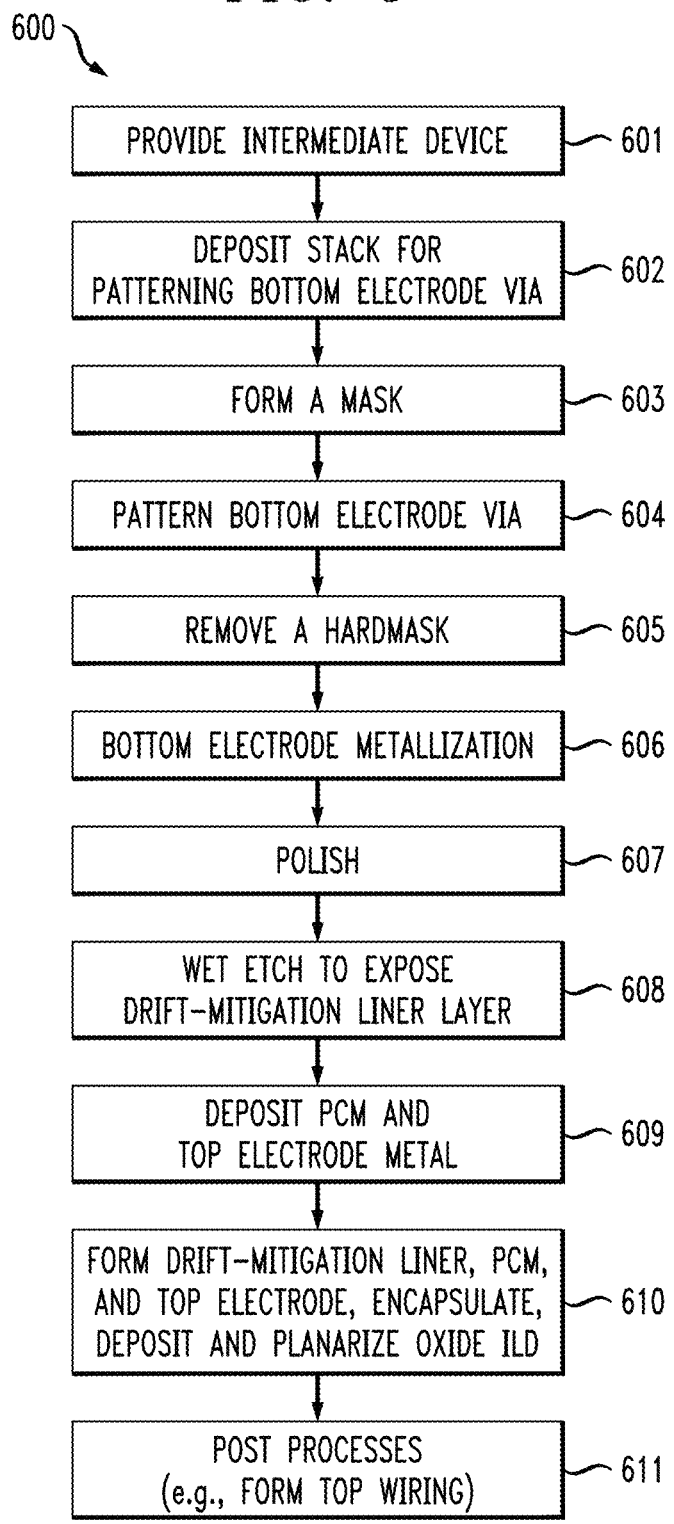
FIG. 6 is a flow diagram of a method for manufacturing a PCM device, according to at least one embodiment of the present invention.

According to some embodiments, a method 600 for manufacturing a non-volatile memory cell containing a drift-mitigation liner in direct contact with a PCM, and where the bottom electrode is also in direct contact with the PCM is shown in FIG. 6. At block 601 an intermediate device is provided comprising a substrate and a lower interconnect disposed in the substrate, a first dielectric layer, a liner layer, and a second dielectric layer (see FIG. 7). The first and second dielectric layers can be formed of, for example, SiN. According to some embodiments, the second dielectric layer is a sacrificial SiN film encapsulating the liner layer, which prevents oxidation of the liner layer during subsequent process steps (e.g., patterning of the bottom electrode via).

The liner layer can be deposited by, for example, a physical vapor deposition (PVD), chemical vapor deposition (CVD), or atomic layer deposition (ALD).

Figure 8:
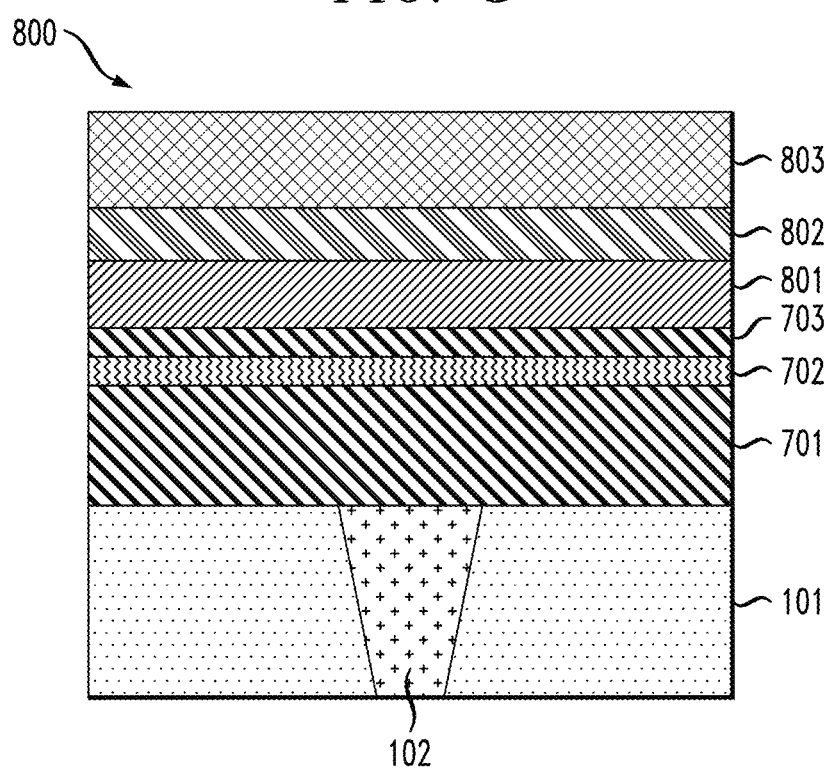

At block 602 the method includes depositing a stack for patterning a bottom electrode via (see FIG. 8). The stack can comprise a low-temperature oxide (LTO) hardmask layer, a Silicon-Containing Anti-Reflective Coating Layer (SiARC) layer, and a photoresist (PR) layer. At block 603, the PR layer is patterned to form a PR mask.

Figure 9:
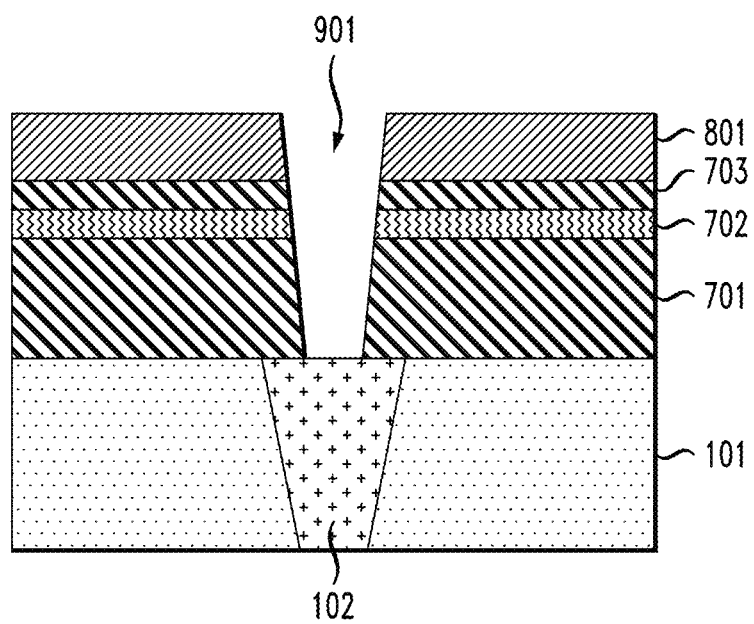

At block 604, the bottom electrode via is patterned through the drift-mitigation liner layer using the PR mask (see FIG. 9).

At block 605 the LTO hardmask is removed (e.g., by a wet-etch process), and at block 606 a bottom electrode metallization process is performed. The bottom electrode metallization process can include depositing, sequentially, a first TaN layer, a TiN layer, and a second TaN layer (see FIG. 10). At block 607 the device is polished, stopping on, or in, the second dielectric layer.

At block 608 a wet-etch is performed, which removes a remainder of second dielectric layer. According to some embodiments, the wet-etch does not impact the liner layer (see FIG. 11).

Figure 12:
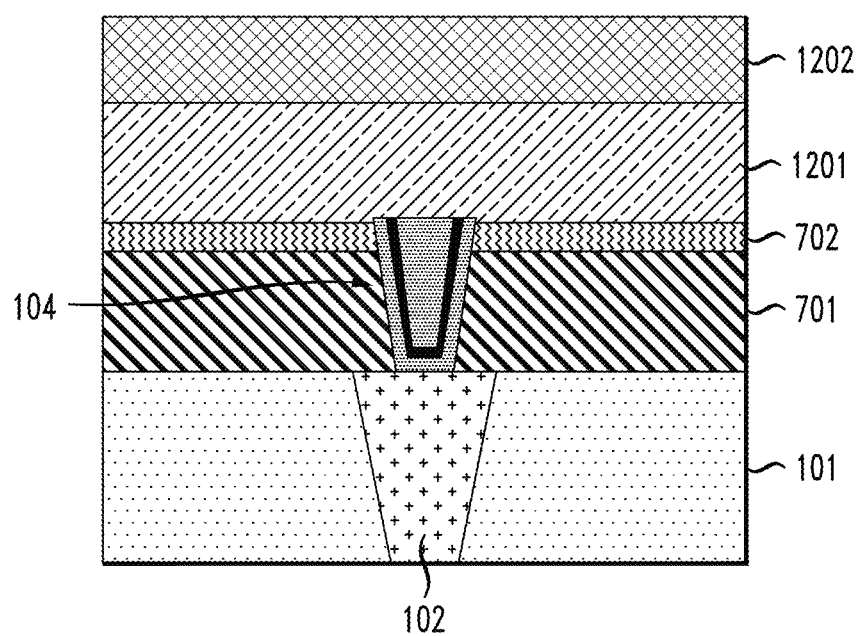

At block 609 a PCM layer and a top electrode metal are deposited (see FIG. 12). According to some embodiment, the PCM layer and the top electrode metal are deposited by PVD.

At block 610 the drift-mitigation liner layer, the PCM layer and the top electrode metal are patterned to form the drift-mitigation line, the PCM and the top electrode. Further, a third dielectric layer (e.g., of SiN) is deposited over the non-volatile memory cell, and an oxide interlayer dielectric (ILD) is deposited and planarized forming the device 100 of FIG. 1.

Subsequent wiring levels can be formed on the resulting device 100 at block 611.

Figure 7:
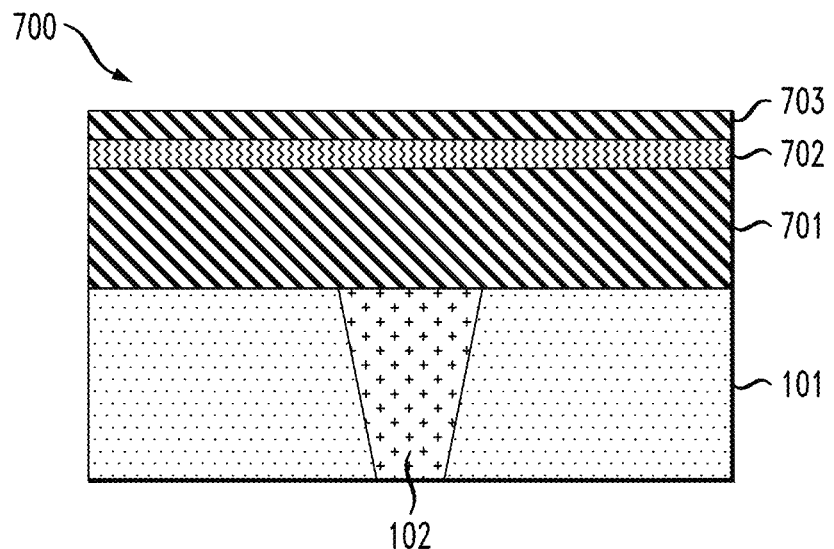
FIGS. 7-12 illustrate intermedia structures in a method for manufacturing the PCM device of FIG. 1, according to at least one embodiment of the present invention.

Referring to FIGS. 7-12, in a method for manufacturing a non-volatile memory cell 100 containing a drift-mitigation liner in direct contact with a PCM as shown in FIG. 1, FIG. 7 shows an intermediate device 700 comprising a substrate 101 and a lower interconnect 102 disposed in the substrate, a first dielectric layer 701, a drift-mitigation liner layer 702, and a second dielectric layer 703. The first and second dielectric layers can be formed of, for example, SiN. According to some embodiments, the second dielectric layer is a sacrificial SiN film encapsulating the liner layer, which prevents oxidation of the liner layer during subsequent process steps (e.g., bottom electrode via patterning). The liner layer 702 can be deposited by, for example, a physical vapor deposition (PVD), chemical vapor deposition (CVD), or atomic layer deposition (ALD).

FIG. 8 shows a deposited stack 800 for patterning a bottom electrode via (not shown). The stack 800 can comprise a LTO hardmask layer 801, a SiARC layer 802, and a PR layer 803. The PR layer is patterned to form a PR mask (not shown) by a photolithographic process.

According to some embodiment, a bottom electrode via 901 is patterned through the drift-mitigation liner layer 702 using the PR layer as a mask (see FIG. 9). The bottom electrode via 901 extends to the lower interconnect 102. The PR mask (not shown) can be removed by, for example, a solvent.

Figure 10:
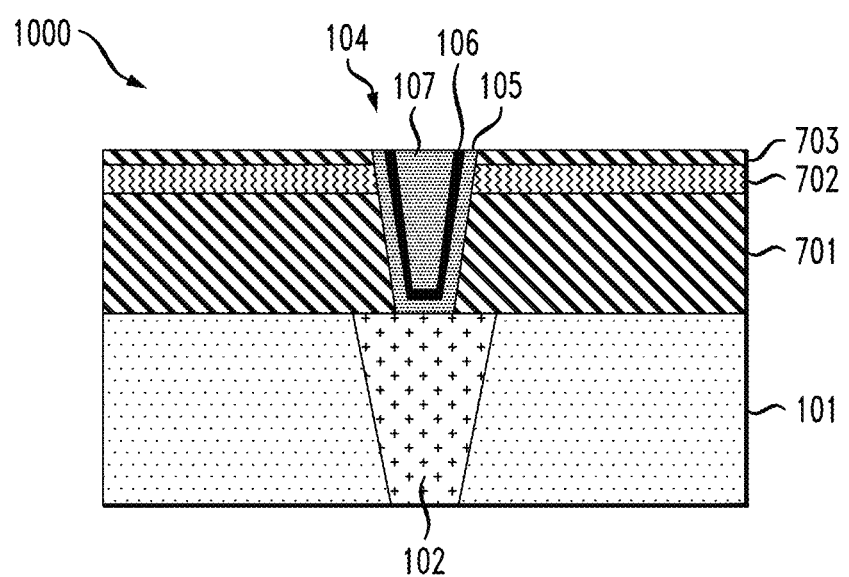

As shown in FIG. 10, the LTO hardmask 801 is removed to expose the second dielectric layer 703. A bottom electrode metallization process is performed to form a bottom electrode 104 comprising an outer portion 105 formed of a TaN, a middle portion 106 formed of a TiN, and an inner portion 107 formed of TaN. For example, the bottom electrode metallization process includes depositing, sequentially, layers of TaN, TiN, and TaN. The device 1000 of FIG. 10 has been polished to expose the second dielectric layer 703. The bottom electrode metallization process can include depositing, sequentially, a first TaN layer, a TiN layer, and a second TaN layer (see FIG. 10).

Figure 11:
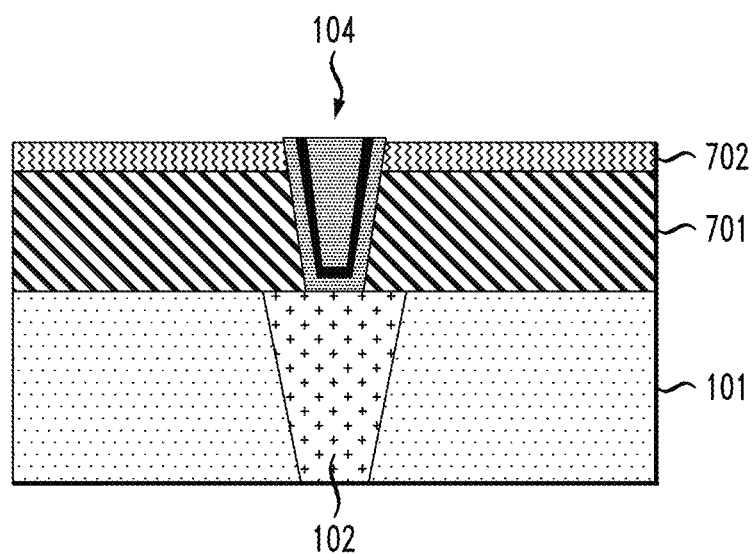

According to some embodiments, a wet-etch is performed to remove a remainder of second dielectric layer 703 (see FIG. 10), without impacting the drift-mitigation liner layer 702 (see FIG. 11).

FIG. 12 shows a PCM layer 1201 and a top electrode metal 1202 deposited on the drift-mitigation liner layer 702. According to some embodiment, the PCM layer 1201 and the top electrode metal 1202 are deposited by PVD.

The drift-mitigation liner layer 702, the PCM layer 1201, and the top electrode metal 1202 are patterned to form the drift-mitigation liner 108, the PCM 109, and the top electrode 110 as shown in FIG. 1. Further, a third dielectric layer 112 (e.g., of SiN) is deposited over the non-volatile memory cell, and an oxide interlayer dielectric (ILD) 111 is deposited and planarized (see FIG. 1).

Recapitulation:

According to an embodiment of the present invention, a mushroom-type Phase-Change Memory (PCM) device comprising a substrate (101), a first dielectric layer (103) disposed on the substrate, a bottom electrode (104) disposed in the first dielectric layer, a drift-mitigation liner (108) disposed on the first dielectric layer, a PCM element (109) disposed directly on the drift-mitigation liner and an upper surface of the bottom electrode, a top electrode (110) disposed on the PCM element, and a second dielectric layer (112) disposed on an exposed portion of the first dielectric layer and the top electrode, wherein the second dielectric layer is disposed on sidewalls of the drift-mitigation liner, the PCM element, and the top electrode.

According to some embodiments, a mushroom-type Phase-Change Memory (PCM) device comprises a substrate (101), a lower interconnect (102) disposed in the substrate, a first dielectric layer (103) disposed on the substrate, a bottom electrode (104) disposed in the first dielectric layer and extending above an upper surface of the first dielectric layer, a drift-mitigation liner (108) encircling an upper portion of the bottom electrode extending above the upper surface of the first dielectric layer, a PCM element (109) disposed on the liner and an upper surface of the bottom electrode, a top electrode (110) disposed on the PCM element, and a second dielectric layer (112) disposed on an exposed portion of the first dielectric layer and the top electrode, wherein the second dielectric layer is disposed on sidewalls of the liner, the PCM element, and the top electrode.

According to some embodiments, a method of manufacturing a mushroom-type Phase-Change Memory (PCM) device includes providing an intermediate device (801) comprising a substrate and a lower interconnect disposed in the substrate, a first dielectric layer disposed on the substrate, a drift-mitigation liner disposed on the first dielectric layer, and a second dielectric layer formed on the drift-mitigation liner, depositing, sequentially, a low-temperature oxide (LTO) hardmask layer, a Silicon-Containing Anti-Reflective Coating Layer (SiARC) layer, and a photoresist (PR) layer on the intermediate device (802), patterning the PR layer to form a PR mask (803), forming a bottom electrode via by patterning through the drift-mitigation liner layer using the PR mask (804), removing the LTO hardmask layer (805), performing a bottom electrode metallization process to form a bottom electrode metal (806), polishing the PCM device to exposing the second dielectric layer (807), removing a remainder of second dielectric layer (808), depositing a PCM layer and a top electrode metal (809), patterning the drift-mitigation liner layer, the PCM layer and the top electrode metal are to form the drift-mitigation liner, a PCM and a top electrode (810), depositing a third dielectric layer over the PCM device (810), depositing an oxide interlayer dielectric (ILD) over the PCM device (810); and planarizing the PCM device (810).

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A mushroom-type Phase-Change Memory (PCM) device comprising:
    a substrate;
    a first dielectric layer disposed on the substrate;
    a bottom electrode disposed in the first dielectric layer;
    a drift-mitigation liner disposed on the first dielectric layer;
    a PCM element disposed directly on the drift-mitigation liner and an upper surface of the bottom electrode;
    a top electrode disposed on the PCM element; and
    a second dielectric layer disposed on an exposed portion of the first dielectric layer and the top electrode, wherein the second dielectric layer is disposed on sidewalls of the drift-mitigation liner, the PCM element, and the top electrode.

2. The PCM device of claim 1, wherein the first dielectric layer and the second dielectric layer are formed of a silicon nitride (SiN).

3. The PCM device of claim 1, further comprising an oxide layer disposed on the PCM device, wherein the PCM device is planarized to a top of the second dielectric layer.

4. The PCM device of claim 1, wherein the bottom electrode comprises an outer portion formed of a tantalum nitride (TaN), a middle portion formed of a titanium nitride (TiN), and an inner portion formed of TaN.

5. The PCM device of claim 1, wherein the PCM element is formed of a material formed of a germanium-antimony-tellurium (GST) material.

6. The PCM device of claim 1, wherein the PCM element is formed a binary or ternary alloy composition including at least one of germanium (Ge), antimony (Sb), and tellurium (Te).

7. The PCM device of claim 1, wherein the PCM element includes a dopant.

8. A mushroom-type Phase-Change Memory (PCM) device comprising:

a substrate;
a lower interconnect disposed in the substrate;
a first dielectric layer disposed on the substrate;
a bottom electrode disposed in the first dielectric layer and extending above an upper surface of the first dielectric layer;
a drift-mitigation liner encircling an upper portion of the bottom electrode extending above the upper surface of the first dielectric layer;
a PCM element disposed on the drift-mitigation liner and an upper surface of the bottom electrode;
a top electrode disposed on the PCM element; and
a second dielectric layer disposed on an exposed portion of the first dielectric layer and the top electrode, wherein the second dielectric layer is disposed on sidewalls of the drift-mitigation liner, the PCM element, and the top electrode.

9. The PCM device of claim 8, wherein the first dielectric layer and the second dielectric layer are formed of a silicon nitride (SiN).

10. The PCM device of claim 8, further comprising an oxide layer disposed on the PCM device, wherein the PCM device is planarized to a top of the second dielectric layer.

11. The PCM device of claim 8, wherein the bottom electrode comprises an outer portion formed of a tantalum nitride (TaN), a middle portion formed of a titanium nitride (TiN), and an inner portion formed of TaN.

12. The PCM device of claim 8, wherein the upper surface of the bottom electrode directly contacts the PCM element.

13. The PCM device of claim 8, wherein the PCM element is formed of a material formed of a germanium-antimony-tellurium (GST) material.

14. The PCM device of claim 8, wherein the PCM element is formed a binary or ternary alloy composition including at least one of germanium (Ge), antimony (Sb), and tellurium (Te).

15. The PCM device of claim 8, wherein the PCM element includes a dopant.

\* \* \* \* \*